United States Patent
Loftus (10) Patent No.: US 9,989,571 B2
(45) Date of Patent: Jun. 5, 2018

(54) THERMOELECTRIC SYSTEM AND METHOD

(71) Applicant: Jaguar Land Rover Limited, Coventry (GB)

(72) Inventor: Timothy Loftus, Conventry (GB)

(73) Assignee: Jaguar Land Rover Limited, Whitley, Coventry (GB)

( * ) Notice: Subject to any disclaimer, the term of this patent is extended or adjusted under 35 U.S.C. 154(b) by 295 days.

(21) Appl. No.: 14/771,402

(22) PCT Filed: Feb. 26, 2014

(86) PCT No.: PCT/EP2014/053765
§ 371 (c)(1),
(2) Date: Aug. 28, 2015

(87) PCT Pub. No.: WO2014/131808
PCT Pub. Date: Sep. 4, 2014

(65) Prior Publication Data
US 2016/0003882 A1 Jan. 7, 2016

(30) Foreign Application Priority Data
Mar. 1, 2013 (GB) .................................. 1303638.9

(51) Int. Cl.
*G01N 25/00* (2006.01)
*G01R 31/02* (2006.01)
(Continued)

(52) U.S. Cl.
CPC ......... *G01R 31/007* (2013.01); *B60N 2/5685* (2013.01); *F25B 21/04* (2013.01); *G01R 31/2637* (2013.01); *H01L 35/34* (2013.01)

(58) Field of Classification Search
CPC ... G01R 31/007; G01R 31/2637; F25B 21/04; B60N 2/5685; H01L 35/34
(Continued)

(56) References Cited

U.S. PATENT DOCUMENTS 4,639,883 A   1/1987   Michaelis
6,205,790 B1  3/2001   Denkin et al.
(Continued)

FOREIGN PATENT DOCUMENTS

EP    2 500 957 A1    9/2012
WO    WO 2011/127126 A1    10/2011

OTHER PUBLICATIONS

Combined Search and Examination Report, GB 1303638.9, dated Aug. 20, 2013, 6 pages.
(Continued)

*Primary Examiner* — Farhana Hoque
(74) *Attorney, Agent, or Firm* — Myers Bigel, P.A.

(57) ABSTRACT

A method for detecting a fault in a thermoelectric device (102), the method comprising: applying a voltage across the thermoelectric device (102); ceasing to apply the voltage to the thermoelectric device (102) after a predefined period of time; measuring a Seebeck voltage $V_s$ across the thermoelectric device (102); comparing $V_s$ to a first threshold voltage $V_T$; and creating a record of a fault if $V_s$ is below $V_T$.

17 Claims, 4 Drawing Sheets

(51) Int. Cl.
   *G01R 31/00*    (2006.01)
   *H01L 35/34*    (2006.01)
   *B60N 2/56*     (2006.01)
   *F25B 21/04*    (2006.01)
   *G01R 31/26*    (2014.01)

(58) Field of Classification Search
   USPC ............................... 324/451, 750.11, 762.01
   See application file for complete search history.

(56) References Cited

U.S. PATENT DOCUMENTS

| | | |
|---|---|---|
| 2005/0206391 A1 | 9/2005 | Magai et al. |
| 2007/0095378 A1* | 5/2007 | Ito .................. B60N 2/5657 136/203 |
| 2008/0106293 A1 | 5/2008 | Hashimoto |
| 2010/0153066 A1 | 6/2010 | Federer et al. |
| 2012/0234022 A1* | 9/2012 | Langsdorf ............... H01L 35/00 62/3.7 |

OTHER PUBLICATIONS

International Search Report, PCT/EP2014/053765, dated Jun. 27, 2014, 4 pages.

* cited by examiner

THERMOELECTRIC SYSTEM AND METHOD

RELATED APPLICATIONS

This application is a 35 U.S.C. § 371 national stage application of PCT Application No. PCT/EP2014/053765, filed on Feb. 26, 2014, which claims priority from Great Britain Patent Application No. 1303638.9, filed on Mar. 1, 2013, the contents of which are incorporated herein by reference in their entireties. The above-referenced PCT International Application was published in the English language as International Publication No. WO 2014/131808 A1 on Sep. 4, 2014.

TECHNICAL FIELD

This invention relates to a method for detecting a fault in a thermoelectric device, and to a thermoelectric system. Aspects of the invention relate to a method, to a system, to a vehicle and to a seat.

BACKGROUND

A thermoelectric device is a device which uses the thermoelectric effect to convert an electrical voltage to a thermal flux, or to convert a thermal flux to an electrical voltage. Thermoelectric devices are typically solid state devices which take advantage of the Peltier effect and the Seebeck effect to convert voltage to heat flux, and vice versa.

Since they can be used to pump heat, thermoelectric devices can be used as heating or cooling devices. Advantageously, thermoelectric devices can be made very small, so that a thermoelectric device can be used to provide heating or cooling in a small or awkwardly shaped volume. Also, a thermoelectric device need not comprise moving parts, and so may be less likely to suffer a mechanical breakdown than other heating and cooling systems which rely upon fans, pumps or other moving parts. However a thermoelectric device can also be incorporated into a system which uses mechanical parts, such as a fan to create fluid flow and so redistribute heat, if necessary.

UK patent publication number GB2384602 discloses a temperature control device in which a Peltier element can be used to control the temperature of an ink-jet head. A Seebeck voltage is obtained and used by a control means to bring the ink-jet head to a target temperature.

However thermoelectric devices are not immune from breakdown. In particular, a thermoelectric device may become damaged if overheated, and cease to function properly. Therefore it is desirable to be able to monitor thermoelectric devices for damage and, preferably, prevent damage from occurring in the first place. A method or system for detecting a fault in a thermoelectric device, such as an open circuit fault or overheating, would therefore be advantageous.

SUMMARY OF THE INVENTION

In accordance with an aspect of the present invention there is provided a method for detecting a fault in a thermoelectric device, the method comprising:
applying a voltage across the thermoelectric device for a predetermined period of time;
measuring a Seebeck voltage $V_S$ across the thermoelectric device;
comparing $V_S$ to a first threshold voltage $V_T$; and
creating a record of a fault if $V_S$ is below $V_T$.

In this way the thermoelectric device can be tested for an open circuit fault. In normal operation, when a voltage is applied across the thermoelectric device a temperature difference develops between a first side and a second side of the device due to the Peltier effect. When the voltage is removed, the temperature difference then creates a Seebeck voltage $V_S$ which can be measured. Over time, $V_S$ decreases as the first side of the thermoelectric device approaches the temperature of the second side. In the event of an open circuit or another similar fault, the temperature differential between the first side and the second side may not develop. As such, when the voltage is removed, there will be no temperature differential and hence $V_S$ will be zero. Alternatively, the temperature differential may be very small, such that $V_S$ is also very small. In either case, if $V_S$ is below $V_T$ then the fault can be detected by the method according to the invention.

Advantageously, the method can be applied during normal operation of the thermoelectric device without disruption to the device whenever the device switches from an on state, in which voltage is applied across the device, to an off state, in which no voltage is applied and $V_S$ can be measured.

It may be that the method comprises the steps of: applying a voltage across the thermoelectric device; and ceasing to apply the voltage to the thermoelectric device after a predefined period of time.

The thermoelectric device may comprise a device which can use the Peltier effect to generate a heat flux from a voltage. The thermoelectric device can also generate a voltage from a temperature imbalance due to the Seebeck effect. The thermoelectric device may comprise a solid state device.

The thermoelectric device may comprise a fan. The fan may be used to propel fluid across the surface of the thermoelectric device and so maintain the device at a suitable operating temperature. The fan may also be used to propel fluid across the surface of the thermoelectric device in order to heat or cool the fluid. The fluid may then be used to heat or cool other components, as required. The thermoelectric device may further comprise a vent, to guide fluid towards or away from the fan. In place of a fan, the thermoelectric device may comprise a pump or any other device suitable for moving a fluid. The fluid may be air.

Typically, the thermoelectric device is part of an automatic temperature control system, such as a seat heating system in a vehicle.

It may be that the method comprises creating a record of a fault when $V_S \leq V_T$. It may be that the method comprises creating a record of a fault when $V_S < V_T$.

Typically, creating a record of a fault if $V_S$ is below $V_T$ comprises incrementing a first counter. It may be that the method further comprises decrementing the first counter if $V_S$ is above $V_T$. Where a first counter is used, the method may further comprise: comparing the first counter to a threshold counter number; and causing the thermoelectric device to enter a fault mode if the first counter is greater than the threshold counter number.

False positive results may be created in the error check if, for example, a sudden temperature change in the vehicle causes one side of the thermoelectric device to be warmer or colder than expected. By using a counter, the method according to the invention can double check results, and so compensate for false positives. The number of checks necessary to confirm a fault can be set by adjusting the value of the threshold counter number.

Alternatively, the method may comprise decrementing the first counter if $V_S$ is below the threshold $V_T$. The method may then comprise incrementing the first counter if $V_S$ is above the threshold $V_T$. The method may further comprise causing the thermoelectric device to enter a fault mode if the first counter is less than a threshold counter number.

The method may further comprise causing the thermoelectric device to enter a fault mode if $V_S$ is below a second threshold voltage $V_{T2}$. Typically, VT2 would be lower than VT. In this way the method can respond rapidly to very low voltages which are more likely to indicate a fault.

Alternatively, the method may further comprise causing the thermoelectric device to enter a fault mode if $V_S$ is below $V_T$.

It may be that the method further comprising providing a temperature measuring system. It may then further be that the length of the predefined time depends upon a measurement of the temperature measuring system. In this way the thermoelectric device can be operated according to the needs of an automatic temperature control system, for example to maintain a desired temperature in a vehicle seat as measured by the temperature measuring system. For example, a voltage may be applied across the thermoelectric device until the temperature measuring system reports a desired temperature.

The predefined time may also or alternatively depend upon parameters set by a user. The method may further comprise providing a timer. The predefined period of time may then be timed using the timer. The length of the predefined period of time to be timed using the timer may be set according to a temperature detected by the temperature measuring system.

The method may further comprise: driving the thermoelectric device with a pulse width modulation (PWM) signal, the pulse width modulation signal comprising on periods and off periods, the length of the on periods and the off periods being determined by a temperature determined with the temperature measuring system; and measuring $V_S$ during an off period of the pulse width modulation signal.

Therefore the test can be carried out while still operating the thermoelectric device according to the needs of, for example, an automatic temperature control system.

The method may comprise increasing the length of the off periods in the PWM signal such that they are greater than a threshold length of time before measuring $V_S$. Measuring $V_S$ takes a finite amount of time, and if the PWM is switching fast enough, the off periods may not be long enough to allow $V_S$ to be measured. In this way the PWM signal can be adjusted if needed to allow the method to be carried out.

The off periods can be increased either by decreasing the percentage on time, or by forcing both longer on periods and longer off periods, in order to maintain the same total on and off time.

The thermoelectric device typically comprises a first side and a second side. The method may further comprise:
  providing a temperature measuring system;
  measuring $T_1$, the temperature of the first side of the thermoelectric device, using the temperature measuring system;
  determining $\Delta T$, the difference in temperature between the first side and the second side of the thermoelectric device, from the Seebeck voltage;
  calculating $T_2$, where $T_2 = T_1 + \Delta T$;
  comparing $T_2$ to a threshold temperature $T_T$; and
  creating a record of a fault if $T_2$ is above $T_T$.

According to a further aspect of the invention, a method for detecting a fault in a thermoelectric device is provided, wherein the thermoelectric device comprises a first side and a second side, the method comprising:
  providing a temperature measuring system;
  driving the thermoelectric device with a pulse width modulation signal, the pulse width modulation signal comprising on periods and off periods, the length of the on periods and the off periods being determined by a temperature determined with the temperature measuring system;
  measuring a Seebeck voltage $V_S$ across the thermoelectric device during an off period of the pulse width modulation signal,
  measuring $T_1$, the temperature of the first side of the thermoelectric device, using the temperature measuring system;
  determining $\Delta T$, the difference in temperature between the first side and the second side of the thermoelectric device, from the Seebeck voltage;
  calculating $T_2$, where $T_2 = T_1 + \Delta T$;
  comparing $T_2$ to a threshold temperature $T_T$; and
  creating a record of a fault if $T_2$ is above $T_T$.

It can be difficult to determine the temperature of a thermoelectric device, since placing a temperature sensor on the device may impede the operation of the thermoelectric device by acting as a thermal barrier. However it is important to monitor the temperature of the device since, if a fault causes the second side to heat up more than is desired, this may damage the device.

By placing a temperature sensor on the first side of the thermoelectric device $T_1$ can be determined. $\Delta T$ can also be determined by measuring the Seebeck voltage $V_S$ and from this a temperature of the second side, $T_2$, can be calculated according to the method without the need for a direct measurement on the second side.

Once $T_2$ is known, it can be compared to a threshold, hence helping to maintain the device at desirable operating temperatures.

Moreover, by carrying out such a test during the off periods of a PWM signal the disruption to the operation of the thermoelectric device is minimised. Since the PWM signal is determined according to a temperature measurement, the signal can be selected according to the needs of, for example, an automatic temperature control system.

The method may also comprise increasing the length of the off periods in the pulse width modulation signal such that they are greater than a threshold length of time before measuring $V_S$.

The temperature measuring system may comprise multiple temperature measuring sensors. The PWM signal may be chosen according to $T_1$, or $T_2$, or according to a temperature at some other location.

Typically, creating a record of a fault if $T_2$ is above $T_T$ comprises incrementing a second counter. It may be that the method further comprises decrementing the second counter if $T_2$ is below $T_T$. Where a second counter is used, the method may further comprise: comparing the second counter to a second threshold counter number; and causing the thermoelectric device to enter a fault mode if the second counter is greater than the second threshold counter number.

Again, by using a counter, the method according to the invention can double check results, and so compensate for false positives. The number of checks necessary to confirm a fault can be set by adjusting the value of the threshold counter number.

Alternatively, the method may comprise decrementing the second counter if $T_2$ is below the threshold $T_T$. The method may then comprise incrementing the second counter if the $T_2$ is above the threshold $T_T$. The method may further comprise causing the thermoelectric device to enter a fault mode if the second counter is less than a threshold counter number.

The method may comprise causing the thermoelectric device to enter a fault mode if $T_2$ is below a second threshold voltage $T_{T2}$.

Alternatively, the method may further comprise causing the thermoelectric device to enter a fault mode if $T_2$ is above $T_T$.

A further aspect of the invention provides a method for monitoring a thermoelectric device, the method comprising: repeatedly performing a method for detecting a fault in a thermoelectric device as described above. The methods may be performed at regular intervals, for example during the off periods of a PWM signal.

A still further aspect of the invention provides a thermoelectric system, the thermoelectric system comprising a thermoelectric device and a control unit, the control unit being arranged to:
  apply a voltage across the thermoelectric device for a predetermined period of time;
  measure a Seebeck voltage $V_S$ across the thermoelectric device;
  compare $V_S$ to a first threshold voltage $V_T$; and
  create a record of a fault if $V_S$ is below $V_T$.

It may be that the control unit is arranged to: apply a voltage across the thermoelectric device; and cease to apply the voltage to the thermoelectric device after a predefined period of time.

Typically, creating a record of a fault if $V_S$ is below $V_T$ comprises incrementing a first counter. It may be that the control unit is further arranged to decrement the first counter if $V_S$ is above $V_T$. Where a first counter is used, it may be that the control unit is further arranged to: compare the first counter to a threshold counter number; and cause the thermoelectric device to enter a fault mode if the first counter is greater than the threshold counter number.

The control unit may be arranged to enter a fault mode if $V_S$ is below a second threshold voltage $V_{T2}$.

Alternatively, the control unit may be arranged to enter a fault mode if $V_S$ is below $V_T$.

It may be that the thermoelectric system further comprises a temperature measuring system and the length of the predefined time depends upon a measurement of the temperature measuring system. Where this is the case, the control unit may be arrange to: drive the thermoelectric device with a pulse width modulation signal, the pulse width modulation signal comprising on periods and off periods, the length of the on periods and the off periods being determined by a temperature determined with the temperature measuring system; and measure $V_S$ during an off period of the pulse width modulation signal.

The control unit may be further arranged to increase the length of the off periods in the pulse width modulation signal such that they are greater than a threshold length of time before measuring $V_S$.

The thermoelectric system may further comprise a temperature measuring system, and the thermoelectric device may further comprise a first side and a second side. The control unit may then be further arranged to:
  measure $T_1$, the temperature of the first side of the thermoelectric device, using the temperature measuring system;
  determine $\Delta T$, the difference in temperature between the first side and the second side of the thermoelectric device, from the Seebeck voltage;
  calculate $T_2$, where $T_2=T_1+\Delta T$;
  compare $T_2$ to a threshold temperature $T_T$; and
  create a record of a fault if $T_2$ is above $T_T$.

A further aspect of the invention provides a thermoelectric system, the thermoelectric system comprising: a thermoelectric device; a temperature measuring system comprising a first side and a second side; and a control unit, the control unit being arranged to:
  drive the thermoelectric device with a pulse width modulation signal, the pulse width modulation signal comprising on periods and off periods, the length of the on periods and the off periods being determined by a temperature determined with the temperature measuring system;
  measure a Seebeck voltage $V_S$ across the thermoelectric device during an off period of the pulse width modulation signal,
  measure $T_1$, the temperature of the first side of the thermoelectric device, using the temperature measuring system;
  determine $\Delta T$, the difference in temperature between the first side and the second side of the thermoelectric device, from $V_S$;
  calculate $T_2$, where $T_2=T_1+\Delta T$;
  compare $T_2$ to a threshold temperature $T_T$; and
  create a record of a fault if $T_2$ is above $T_T$.

It may be that the control unit is arranged to increase the length of the off periods in the pulse width modulation signal such that they are greater than a threshold length of time before measuring $V_S$.

Creating a record of a fault if $T_2$ is above $T_T$ may comprise incrementing a second counter. The control unit may be further arranged to decrement the second counter if $T_2$ is below $T_T$. Where a second counter is used, the control unit may be further arranged to: compare the second counter to a second threshold counter number; and cause the thermoelectric device to enter a fault mode if the second counter is greater than the second threshold counter number.

The control unit may be arranged to enter a fault mode if $T_2$ is below a second threshold voltage $T_{T2}$.

Alternatively, the control unit may be arranged to enter a fault mode if $T_2$ is above $T_T$.

Entering a fault mode may involve shutting down the thermoelectric device. Alternatively, entering a fault mode may involve reducing the operation of the thermoelectric device. Alternatively or in addition entering a fault mode may comprise reporting an error to a user.

Aspects of the invention also provide:
  a vehicle comprising a thermoelectric device and a control unit, the control unit being arranged to carry out the steps of any method described above;
  a vehicle comprising a thermoelectric system as described above;
  a seat for use in a vehicle, the seat comprising a thermoelectric device and a control unit, the control unit being arranged to carry out the steps of any method described above; and
  a seat for use in a vehicle, the seat comprising a thermoelectric system as described above.

BRIEF DESCRIPTION OF THE DRAWINGS

Embodiments of the invention are further described hereinafter, by way of example only, with reference to the accompanying drawings, in which.

DETAILED DESCRIPTION

Figure 1:
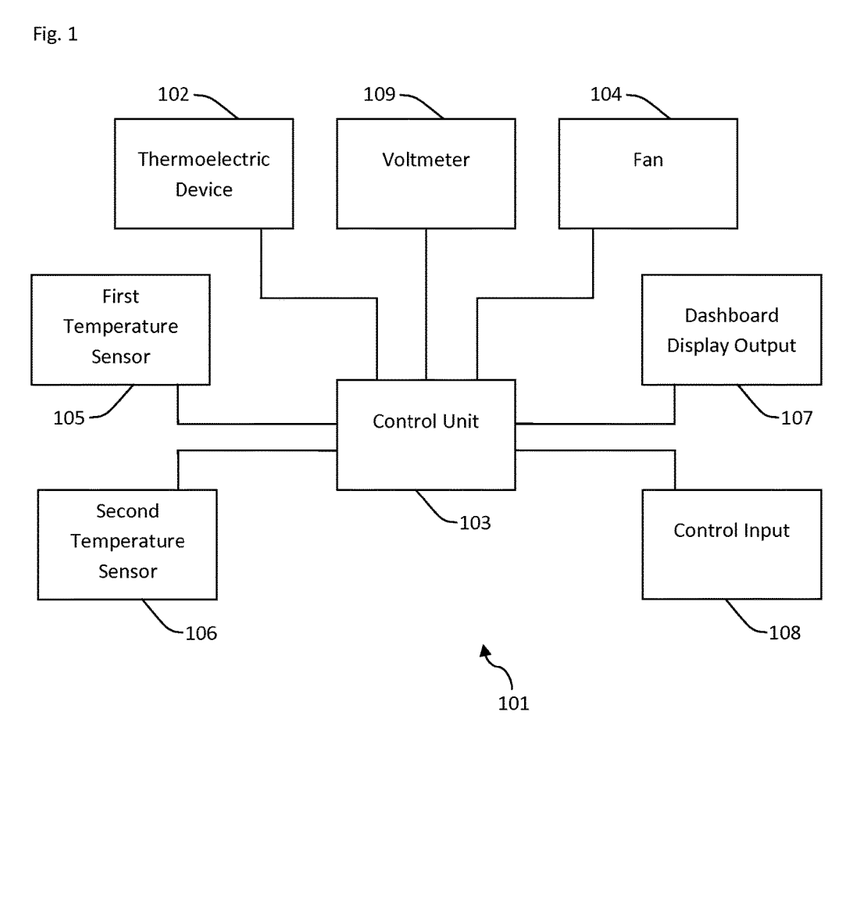
FIG. 1 is a block diagram of a thermoelectric system.

FIG. 1 shows a thermoelectric system 101 according to an embodiment of the invention. The thermoelectric system 101 is intended for use in the seat of a vehicle, in order to provide seat heating or cooling, and so provide more comfort for a user. The thermoelectric system 101 comprises a thermoelectric device 102, which comprises a first side and a second side.

The thermoelectric device 102 is controlled by a control unit 103, which can apply a voltage across the thermoelectric device 102. In use, when the control unit puts a voltage across the thermoelectric device 102, this creates a heat flux between the first side and the second side of the thermoelectric device 102 due to the Peltier effect. Depending upon the polarity of the voltage, the heat flow can be from the first side to the second side, or from the second side to the first side.

Therefore, if a voltage is applied to the thermoelectric device 102 such that the heat flows from the first side to the second side, then the temperature of the first side of the thermoelectric device 102 will drop. Since the first side of the thermoelectric device faces into the seat, this has the effect of cooling the seat. Conversely, if the voltage across the thermoelectric device 102 is reversed, then the heat flows from the second side to the first side, increasing the temperature of the first side of the thermoelectric device 102. The thermoelectric device 102 will then tend to warm the seat in the vehicle.

As such, the thermoelectric system 101 can be used to heat or cool the vehicle seat as required.

The thermoelectric system 101 further comprises a fan 104, which directs an air flow across the second side of the thermoelectric device 102, which helps to maintain the second side of the thermoelectric device 102 at a temperature close to the air temperature in the vehicle.

The thermoelectric system 101 also comprises a first temperature sensor 105 and a second temperature sensor 106. The first temperature sensor 105 is attached to the first side of the thermoelectric device 102, such that the first temperature sensor 105 can measure $T_1$, the temperature of the first side of the thermoelectric device 102, and report $T_1$ to the control unit 103. The second temperature sensor 106 is located within the seat, and measures $T_A$, the ambient temperature in the seat.

The control unit 103 is also provided with a dashboard display output 107 and a control input 108. The control unit 103 provides signals to a display on the dashboard of the vehicle through the dash board display output 107. As such the control unit can notify the user of the temperature of the seat, and notify the user if there is a fault, through the dashboard display.

In use, the control unit 103 receives a signal indicating a target temperature through the control input 108. The target temperature may be set directly by a user, or it may be set by an automatic temperature control system in response to settings entered by the user. The target temperature may also depend upon the status of the vehicle. For example, if the vehicle is a convertible, the target temperature may automatically increase when the vehicle's roof is down, in order to keep the user warm.

Once the control unit 103 has a target temperature, it compares the target temperature with the ambient temperature $T_A$. If $T_A$ is below the target temperature, then the control unit 103 operates the thermoelectric device 102 so as to increase the temperature of the seat. If $T_A$ is above the target temperature, then the control unit 103 operates the thermoelectric device 102 so as to decrease the temperature of the seat.

If $T_A$ is much larger or much smaller than the target temperature, then the control unit is configured to apply a continuous voltage to the thermoelectric device 102. However, if the temperature of the seat needs only a slight adjustment, then the control unit is configure to provide a voltage to the thermoelectric device 102 according to a Pulse Width Modulation (PWM) signal. The PWM signal comprises "on" periods, in which a voltage is applied to the thermoelectric device 102, and "off" periods, in which no voltage is applied to the thermoelectric device. The durations of the on periods and the off periods are determined by the change in temperature required in the seat. If a large change is required then the on periods will be longer and the off periods shorter. For a smaller change, the off periods are longer and the on periods are shorter. As such, as $T_A$ approaches the target temperature, the control unit 103 is configured to vary the PWM signal so as to decrease the on periods and increase the off periods. Once $T_A$ reaches the target temperature, the control unit 103 then provides a PWM signal which is suitable for maintaining $T_A$ at the target temperature. The proportion of the 'on' periods to the 'off' periods is sometimes referred to as the 'duty cycle' of the PWM signal and may be expressed as a percentage, e.g. 100% being fully on. Lastly, the thermoelectric system 101 comprises a voltmeter 109. The voltmeter is attached to the thermoelectric device 102 such that the voltmeter can measure a voltage across the thermoelectric device 102 and report the measured voltage to the control unit 103.

Figure 2:
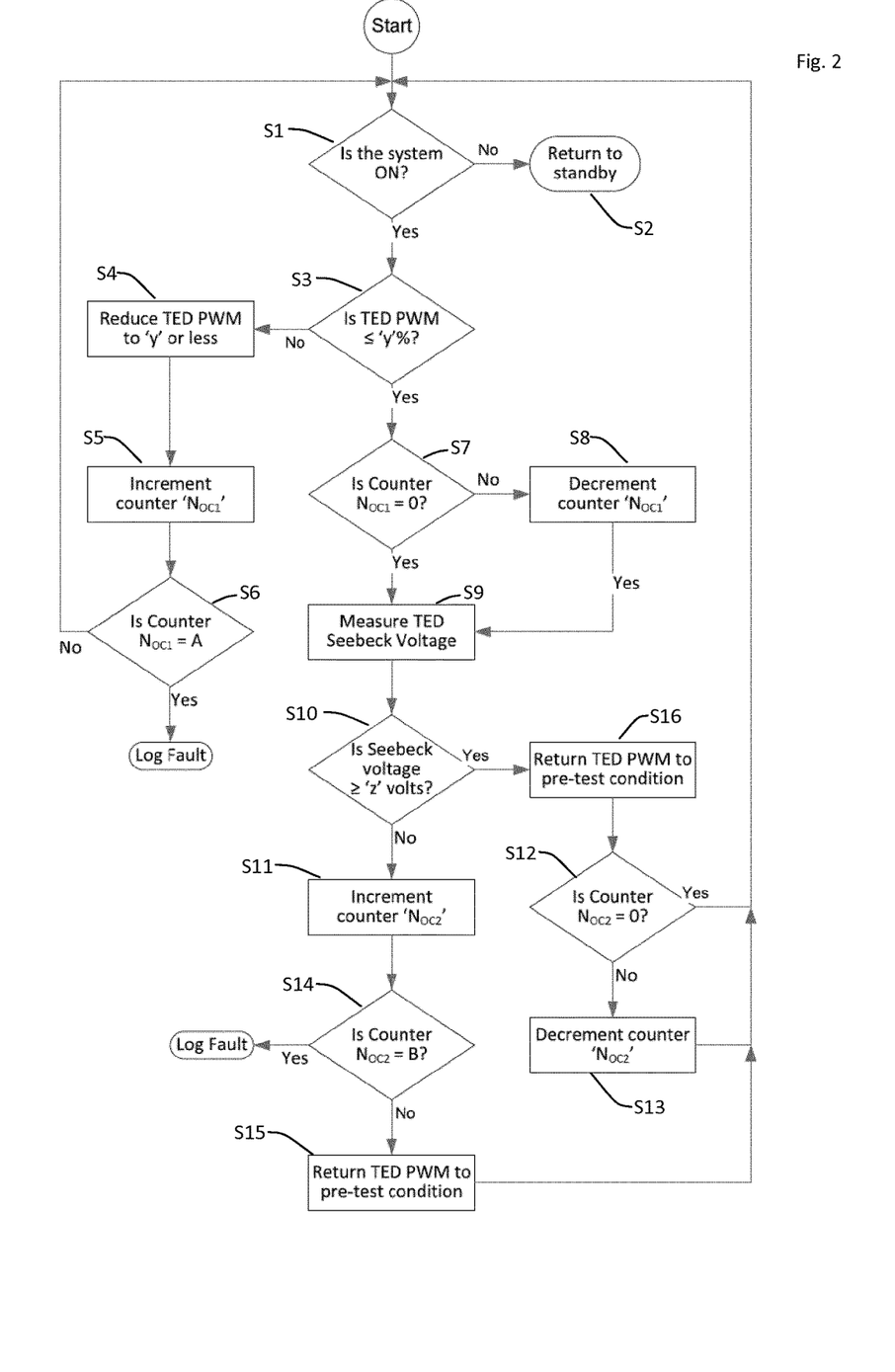
FIG. 2 is a flow chart showing a first method for detecting a fault.

FIG. 2 is a flow chart showing a method for detecting a fault according to one embodiment of the invention, which may be carried out by the control unit 103. If the thermoelectric device develops a fault, then the fault may prevent the thermoelectric device from generating a heat flux when a voltage is applied. As such, the thermoelectric device may be unable to heat or cool the seat. The method shown in FIG. 2 tests for such a fault while the thermoelectric system 101 is in a heating mode, in which the thermoelectric device 102 is used to heat the seat.

At S1 the control unit 103 checks to see if the thermoelectric system 101 is turned on, and operating. If it is not, then the control unit 103 returns to a standby mode at S2. The control unit 103 is configured to perform this check periodically, such that once the system is turned on the control unit 103 will be able to carry out the rest of the method.

If the thermoelectric system 101 is turned on, then the control unit 103 proceeds to S3, in which it checks the PWM signal being supplied to the thermoelectric device 102, which is referred to as the TED PWM in the diagram. In particular, the control unit checks to see if the PWM signal is on less than y % of the time. The threshold figure y can be configured according to the needs of the system, but a typical value is 80%. In order to perform a test according to the method, the PWM must comprise a minimum off time, so if the PWM is on more than y % of the time the control unit 103 proceeds to S4, in which it reduces the on periods of the PWM signal to less than y %.

In an alternative method, a control unit according to the invention may check the duration of the off periods according to the PWM signal, and increase the duration of the off periods if they are below a threshold. The duration of the off periods can be increased without decreasing the percentage on time by also increasing the duration of the on periods.

In step S5, the control unit increments a counter $N_{OC1}$ to indicate that the PWM signal has been changed, before ultimately returning to S1 and proceeding with the test once more. The thermoelectric system 101 may have been damaged in such a way so as to prevent the percentage on time from staying below y %. As such, at S6 the control unit 103 compares $N_{OC1}$ with a threshold A. If $N_{OC1}$ reaches A, then the control unit 103 logs a fault. Otherwise the method continues.

Once the percentage on time is below y, the control unit 103 proceeds to S7. In step S7 and S8 the control unit 103 decrements $N_{OC1}$ by one.

At S9 the control unit 103 measures $V_S$, the Seebeck voltage across the thermoelectric device 102, during an off period in the PWM signal. At S10 the control unit 103 compares $V_S$ to a threshold voltage z.

If $V_S$ is below z, then the control unit 103 increments a counter $N_{OC2}$ at S11. If $V_S$ is above z, then the control unit 103 checks that $N_{OC2}$ is equal to zero at S12. If $N_{OC2}$ is not equal to zero then the control unit 103 decrements the counter $N_{OC2}$ at S13.

If the thermoelectric device 102 is functioning properly and in a heating mode, then the first side of the thermoelectric device 102 should heat up during each on period, while the second side of the thermoelectric device 102 cools. As such, during the off period heat will tend to flow back from the first side to the second side, creating a Seebeck voltage $V_S$ across the thermoelectric device 102. If the thermoelectric system is broken, then the difference in temperature between the first side and the second side may be reduced or even non-existent. As such, $V_S$ will drop.

If $N_{OC2}$ is incremented, then the control unit 103 compares $N_{OC2}$ to a threshold B at S14. If $N_{OC2}$ reaches B, then the control unit 103 logs a fault. If no fault is logged, then the control unit 103 returns the PWM signal to pre-test conditions at S15 or S16 and returns to S1. The control unit 103 may be configured to wait a predefined period of time before returning to S1, in order that the testing does not interfere with the ordinary operation of the thermoelectric system 101.

The control unit 103 can be configured such that the threshold voltage z depends upon the percentage on time of the PWM signal. Therefore the control unit 103 can take account of a smaller temperature change cause by a reduced on time.

Although the method above has been described as being used when the thermoelectric system 101 is in a heating mode, the same method can be used when the thermoelectric system is in a cooling mode, with an appropriate adjustment to value of z, since the voltage polarity will be reversed.

Figure 3:
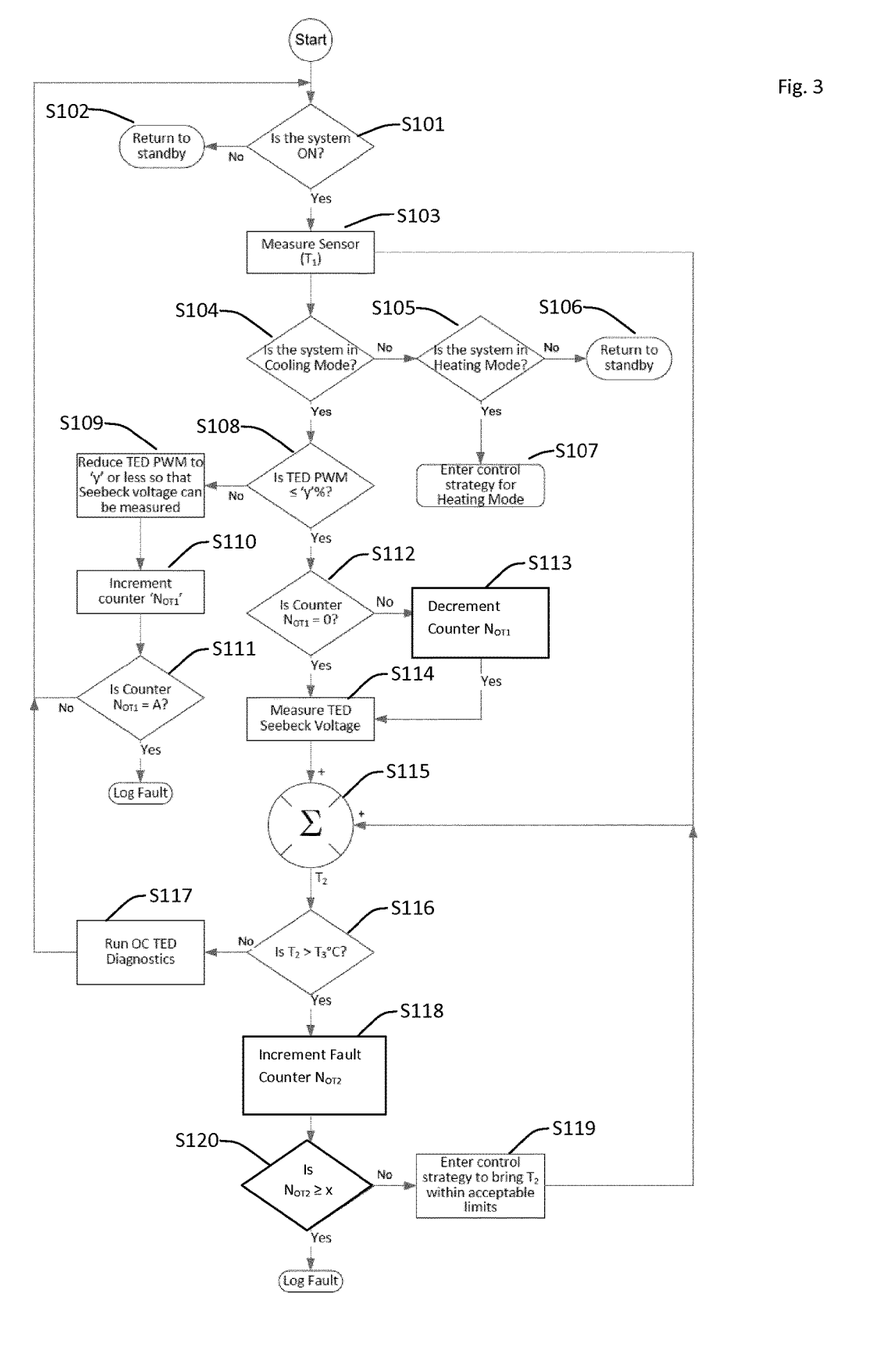
FIG. 3 is a flow chart showing a second method for detecting a fault.

FIG. 3 is a flow chart showing a method for detecting a fault according to another embodiment of the invention, which may be carried out by the control unit 103. If the thermoelectric device develops a fault, then the fault may cause the second side of the thermoelectric device to become too hot. However it is not straightforward to measure the temperature of the second side of the thermoelectric device 102, since a sensor in this location would impede the air flow to the thermoelectric device 102 and could therefore cause overheating in and of itself. The method shown in FIG. 3 tests for overheating without the need for a further temperature sensor.

At S101 the control unit 103 checks to see if the thermoelectric system 101 is turned on, and operating. If it is not, then the control unit 103 returns to a standby mode at S102. The control unit 103 is configured to perform this check periodically, such that once the system is turned on the control unit 103 will be able to carry out the rest of the method.

If the thermoelectric system 101 is turned on, then the control unit 103 proceeds to S103, in which it checks $T_1$, the temperature of the first side of the thermoelectric device 102, which is measured by the first temperature sensor.

In S104, S105, S106 and S107 the control unit 103 checks which mode the thermoelectric system 101 is in. If the system is in a cooling mode, in which it reduces the temperature of the seat, then the method continues. Otherwise another appropriate control strategy is chosen.

At S108 the control unit 103 checks the PWM signal being supplied to the thermoelectric device 102. In particular, the control unit checks to see if the PWM signal is on less than y % of the time. Again, the threshold figure y can be configured according to the needs of the system, but a typical value is 80%. In order to perform a test according to the method, the PWM must comprise a minimum off time, so if the PWM is on more than y % of the time the control unit 103 proceeds to S109, in which it reduces the on periods of the PWM signal to less than y %.

As in the previous method, in S110 and S111 the control unit 103 increments a counter $N_{OT1}$ and compares that counter to a threshold A, such that if the thermoelectric system is damaged such that the PWM on time cannot be reduced to less than y, a fault is logged. Once the percentage on time is below y, the control unit 103 proceeds to S112. In S112 and S113 the control unit 103 decrements $N_{OT1}$ by one.

At S114 the control unit 103 measures $V_S$, the Seebeck voltage across the thermoelectric device 102, during an off period in the PWM signal. From $V_S$, the control unit can calculate $\Delta T$, the difference in temperature between the first side and the second side of the thermoelectric device 102.

At S115 the control unit 103 sums $T_1$ and $\Delta T$ to get $T_2$, the temperature of the second side of the thermoelectric device 102.

At S116 the control unit 103 compares $T_2$ to a threshold temperature $T_3$.

If $T_2$ is below $T_3$, then the control unit proceeds to S117, in which the control unit 103 runs further diagnostics according to the method shown in FIG. 2 to check for an open circuit (OC) fault before returning to S101. Advantageously, the OC fault check can be carried out using the same measurement of $V_S$ as the use in S114 of FIG. 3, reducing the amount of disruption to the operation of the thermoelectric system.

If $T_2$ is above $T_3$, this indicates that the second side of the thermoelectric device 102 is too hot, which may damage the thermoelectric device 102 or some other component. The control device 103 therefore increments a counter $N_{OT2}$ at S118 and enters a control strategy to bring $T_2$ within acceptable limits at S119. The control strategy may comprise increasing the speed of the fan 104, changing the PWM signal, or temporarily shutting down the thermoelectric device 102. Once the control strategy has been implemented, the control unit 103 recalculates $T_2$ and checks to see if $T_2$ is now below $T_3$ at S115 and S116 again.

Each time $N_{OT2}$ is incremented, the control unit 103 checks to see if $N_{OT2}$ has reached a threshold value x at S120. When $N_{OT2}$ reaches x, a fault is logged.

The use of counters in the above methods helps to ensure that a temporary fluctuation in temperature, for example due to a change in the ambient temperatures around the vehicle, is not misdiagnosed as a fault.

When a fault is logged, the control unit 103 may be configured to display the fault to the user via the dashboard display output 107. Alternatively the fault may simply be stored for later retrieval by an engineer. Also, when a fault is logged the control unit 103 may be configured to cease or reduce the operation of the thermoelectric system, in order to reduce the potential for further damage.

Figure 4:
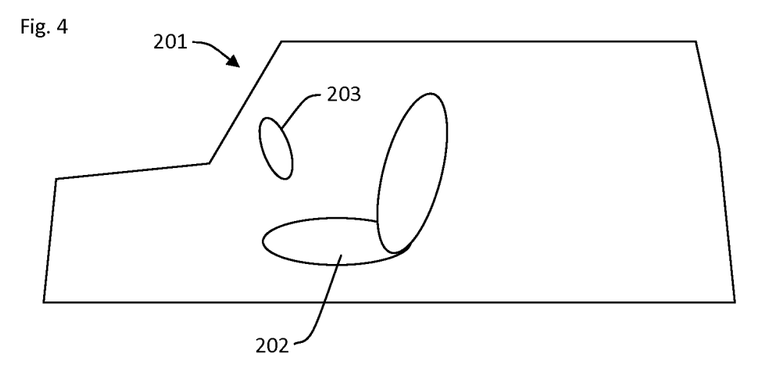
FIG. 4 illustrates a vehicle with a thermoelectric system according to embodiments of the present invention.

In the embodiments above the thermoelectric system 101 is described for use in a vehicle, and in particular for use in a seat. However it may have various other uses. FIG. 4 shows a car 201 which comprises a seat 202 and a steering wheel 203. Both the seat 202 and the steering wheel 203 comprise a thermoelectric system 101 according to the invention. Hence both the seat and the steering wheel can be heated or cooled according to the user's needs. A thermoelectric system 101 can also be used in motorbike handles and seats, and in under floor heating for vehicles such as car 201. A thermoelectric system 101 could also be used in applications other than in vehicles, wherever heating or cooling is desirable.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A method for detecting a fault in a thermoelectric device, the method comprising:
    applying a voltage across the thermoelectric device for a predetermined period of time;
    measuring a Seebeck voltage $V_S$ across the thermoelectric device;
    comparing $V_S$ to a first threshold voltage $V_T$; and
    creating a record of a fault if $V_S$ is below $V_T$;
    using a temperature measuring system, wherein a length of the predefined period of time depends upon a measurement of the temperature measuring system;
    driving the thermoelectric device with a pulse width modulation signal, the pulse width modulation signal comprising on periods and off periods, a length of the on periods and the off periods being determined by a temperature determined with the temperature measuring system; and
    measuring $V_S$ during an off period of the pulse width modulation signal.

2. The method of claim 1, wherein creating a record of a fault if $V_S$ is below $V_T$ comprises incrementing a first counter.

3. The method of claim 2, further comprising decrementing the first counter if $V_S$ is above $V_T$.

4. The method of claim 2, wherein the method further comprises:
    comparing the first counter to a threshold counter number; and
    causing the thermoelectric device to enter a fault mode if the first counter is greater than the threshold counter number.

5. The method of claim 1, the method further comprising:
    increasing the length of the off periods in the pulse width modulation signal such that they are greater than a threshold length of time before measuring $V_S$.

6. The method of claim 1, wherein the thermoelectric device comprises a first side and a second side, the method further comprising:
    measuring $T_1$, a temperature of the first side of the thermoelectric device, using the temperature measuring system;
    determining $\Delta T$, a difference in temperature between the first side and the second side of the thermoelectric device, from the Seebeck voltage;
    calculating $T_2$, where $T_2 = T_1 + \Delta T$;
    comparing $T_2$ to a threshold temperature $T_T$; and
    creating a record of a fault if $T_2$ is above $T_T$.

7. A method for monitoring a thermoelectric device, the method comprising:
    repeatedly performing a method for detecting a fault in a thermoelectric device according to claim 1.

8. A vehicle comprising a thermoelectric device and a control unit, the control unit being arranged to carry out the method of claim 1.

9. A seat for use in a vehicle, the seat comprising a thermoelectric device and a control unit, the control unit being arranged to carry out the method of claim 1.

10. A method for detecting a fault in a thermoelectric device, wherein the thermoelectric device comprises a first side and a second side, the method comprising:
    driving the thermoelectric device with a pulse width modulation signal, the pulse width modulation signal comprising on periods and off periods, a length of the on periods and the off periods being determined by a temperature determined with a temperature measuring system;
    measuring a Seebeck voltage $V_S$ across the thermoelectric device during an off period of the pulse width modulation signal,
    measuring $T_1$, a temperature of the first side of the thermoelectric device, using the temperature measuring system;
    determining $\Delta T$, a difference in temperature between the first side and the second side of the thermoelectric device, from the Seebeck voltage;
    calculating $T_2$, where $T_2 = T_1 + \Delta T$;
    comparing $T_2$ to a threshold temperature $T_T$; and
    creating a record of a fault if $T_2$ is above $T_T$.

11. A thermoelectric system, comprising:
    a thermoelectric device;
    temperature measuring system; and
    a control unit, the control unit being arranged to:
        apply a voltage across the thermoelectric device for a predefined period of time;

measure a Seebeck voltage $V_S$ across the thermoelectric device;

compare $V_S$ to a first threshold voltage $V_T$; and create a record of a fault if $V_S$ is below $V_T$;

wherein a length of the predefined period of time depends upon a measurement of the temperature measuring system; and wherein creating a record of a fault if $V_S$ is below $V_T$ comprises incrementing a first counter, wherein the control unit is further arranged to:

compare the first counter to a threshold counter number; and cause the thermoelectric device to enter a fault mode if the first counter is greater than the threshold counter number.

12. The thermoelectric system of claim 11, wherein the control unit is further arranged to decrement the first counter if $V_S$ is above $V_T$.

13. The thermoelectric system of claim 11, wherein the control unit is arranged to:

drive the thermoelectric device with a pulse width modulation signal, the pulse width modulation signal comprising on periods and off periods, a length of the on periods and the off periods being determined by a temperature determined with the temperature measuring system;

measure $V_S$ during an off period of the pulse width modulation signal; and increase the length of the off periods in the pulse width modulation signal such that they are greater than a threshold length of time before measuring $V_S$.

14. The thermoelectric system of claim 11, wherein the thermoelectric system further comprises a temperature measuring system and the thermoelectric device comprises a first side and a second side, where the control unit is further arranged to:

measure $T_1$, a temperature of the first side of the thermoelectric device, using the temperature measuring system;

determine $\Delta T$, a difference in temperature between the first side and the second side of the thermoelectric device, from the Seebeck voltage;

calculate $T_2$, where $T_2 = T_1 + \Delta T$;

compare $T_2$ to a threshold temperature $T_T$; and create a record of a fault if $T_2$ is above $T_T$.

15. A vehicle comprising a thermoelectric system according to claim 11.

16. A seat for use in a vehicle, the seat comprising a thermoelectric system according to claim 11.

17. A thermoelectric system, comprising:

a thermoelectric device;

a temperature measuring system comprising a first side and a second side; and a control unit, the control unit being arranged to:

drive the thermoelectric device with a pulse width modulation signal, the pulse width modulation signal comprising on periods and off periods, a length of the on periods and the off periods being determined by a temperature determined with the temperature measuring system;

measure a Seebeck voltage $V_S$ across the thermoelectric device during an off period of the pulse width modulation signal, measure $T_1$, a temperature of the first side of the thermoelectric device, using the temperature measuring system;

determine $\Delta T$, a difference in temperature between the first side and the second side of the thermoelectric device, from $V_S$;

calculate $T_2$, where $T_2 = T_1 + \Delta T$;

compare $T_2$ to a threshold temperature $T_T$; and create a record of a fault if $T_2$ is above $T_T$.

* * * * *